US009951231B2

(12) United States Patent
Mu (10) Patent No.: US 9,951,231 B2
(45) Date of Patent: Apr. 24, 2018

(54) COPPER-CONTAINING CONDUCTIVE PASTES AND ELECTRODES MADE THEREFROM

(71) Applicant: E I DU PONT DE NEMOURS AND COMPANY, Wilmington, DE (US)

(72) Inventor: Minfang Mu, Shanghai (CN)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 15/505,682

(22) PCT Filed: Aug. 28, 2014

(86) PCT No.: PCT/CN2014/085377
§ 371 (c)(1),
(2) Date: Feb. 22, 2017

(87) PCT Pub. No.: WO2016/029397
PCT Pub. Date: Mar. 3, 2016

(65) Prior Publication Data
US 2017/0275477 A1   Sep. 28, 2017

(51) Int. Cl.
| H01B 1/16 | (2006.01) |
| H01B 1/22 | (2006.01) |
| H01L 31/14 | (2006.01) |
| C09D 5/24 | (2006.01) |
| H01L 31/0224 | (2006.01) |
| H01M 4/04 | (2006.01) |

(52) U.S. Cl.
CPC .............. *C09D 5/24* (2013.01); *H01B 1/16* (2013.01); *H01B 1/22* (2013.01); *H01L 31/0224* (2013.01); *H01M 4/0402* (2013.01)

(58) Field of Classification Search
CPC ..... H01B 1/00; H01B 1/16; H01B 1/22; B05D 5/12; H01L 31/0224; H01L 31/14; C22C 9/00; B22F 7/08
See application file for complete search history.

(56) References Cited

U.S. PATENT DOCUMENTS

| 4,273,583 A | 6/1981 | Tyran |
| 4,331,714 A | 5/1982 | Tyran |
| 4,388,347 A | 6/1983 | Shum et al. |
| 5,296,413 A | 3/1994 | Carroll et al. |
| (Continued) | | |

FOREIGN PATENT DOCUMENTS

| CN | 1072940 A | 6/1993 |
| CN | 1495804 A | 5/2004 |
| (Continued) | | |

OTHER PUBLICATIONS

Machine translation (English) of JP2000-048640. (Year: 2000).*
(Continued)

*Primary Examiner* — Mark Kopec (57) ABSTRACT

Disclosed herein are copper-containing (Cu-containing) conductive pastes, copper (Cu) electrodes formed by firing the Cu-containing conductive paste over a substrate, and articles comprising a structural element with such Cu electrodes, wherein, the Cu-containing conductive paste contains a powder of coated Cu particles and glass frit dispersed in an organic medium.

17 Claims, 3 Drawing Sheets

(56) References Cited

U.S. PATENT DOCUMENTS

| | | | |
|---|---|---|---|
| 5,442,145 A * | 8/1995 | Imai | H01L 23/498 174/256 |
| 7,316,725 B2 | 1/2008 | Kodas et al. | |
| 7,572,314 B2 | 8/2009 | Choi et al. | |
| 8,647,815 B1 | 2/2014 | Kuroki et al. | |
| 2004/0051085 A1 | 3/2004 | Moriya | |
| 2010/0108366 A1 | 5/2010 | Kim et al. | |
| 2011/0031448 A1 | 2/2011 | Ota et al. | |
| 2011/0180137 A1 | 7/2011 | Iwamuro et al. | |
| 2011/0203659 A1 | 8/2011 | Carroll et al. | |
| 2011/0315217 A1 | 12/2011 | Gee | |
| 2012/0090882 A1 | 4/2012 | Ishimatsu et al. | |
| 2012/0240994 A1 | 9/2012 | Kim et al. | |
| 2012/0312368 A1 | 12/2012 | Hang et al. | |
| 2013/0321979 A1 | 12/2013 | Park et al. | |
| 2017/0287587 A1 | 10/2017 | Mu et al. | |

FOREIGN PATENT DOCUMENTS

| | | |
|---|---|---|
| CN | 101061243 A | 10/2007 |
| CN | 101246759 A | 8/2008 |
| CN | 101441904 A | 5/2009 |
| CN | 102290453 A | 12/2011 |
| CN | 102473563 A | 5/2012 |
| CN | 103310870 A | 9/2013 |
| CN | 103514975 A | 1/2014 |
| CN | 103515480 A | 1/2014 |
| CN | 103578561 A | 2/2014 |
| CN | 103578651 A | 2/2014 |
| GB | 2418432 A | 3/2006 |
| JP | 03-078906 A | 4/1991 |
| JP | 2000-048640 A | 2/2000 |
| JP | 2004-002923 A | 1/2004 |
| JP | 2004-156061 A | 6/2004 |
| JP | 2004-156062 A | 6/2004 |
| JP | 2004-232036 A | 8/2004 |
| JP | 2005-136260 A | 5/2005 |
| JP | 2006-019306 A | 1/2006 |
| JP | 2006-225691 A | 8/2006 |
| JP | 2006-225692 A | 8/2006 |
| JP | 2008-138266 A | 6/2008 |
| JP | 2008-255509 A | 10/2008 |
| JP | 2009-081142 A | 4/2009 |
| JP | 2010-013730 A | 1/2010 |
| JP | 2010-126022 A | 6/2010 |
| JP | 2011-006719 A | 1/2011 |
| JP | 2011-006739 A | 1/2011 |
| JP | 2011-006740 A | 1/2011 |
| JP | 2012-076086 A | 4/2012 |
| JP | 2012-157870 A | 8/2012 |
| JP | 2012-179624 A | 9/2012 |
| JP | 2013-117053 A | 6/2013 |
| JP | 2017-535024 A | 11/2017 |
| KR | 10-2013-0065445 A | 6/2013 |
| WO | 2012/122409 A2 | 9/2012 |
| WO | 2013/090498 A1 | 6/2013 |
| WO | 2013/154960 A1 | 10/2013 |

OTHER PUBLICATIONS

Machine translation (English) of JP2011-006739. (Year: 2011).*
PCT International Search Report for Application No. PCT/CN2014/085386; Chen, Junhong, Authorized Officer; ISA/CN; dated May 8, 2015.
PCT International Search Report for Application No. PCT/CN2014/085379; Yang, Jia, Authorized Officer; ISA/CN; dated Dec. 16, 2014.
PCT International Search Report for Application No. PCT/CN2014/085377; Wang, Weiwei, Authorized Officer; ISN/CN; dated May 7, 2015.

* cited by examiner

COPPER-CONTAINING CONDUCTIVE PASTES AND ELECTRODES MADE THEREFROM

FIELD OF THE INVENTION

The invention relates to a copper-containing conductive pastes and electrodes made therefrom by firing.

BACKGROUND OF THE INVENTION

Precious metal powder, such as silver powder, is used in the electronics industry for the manufacture of conductive pastes. The conductive pastes are screen printed onto substrates forming conductive circuit patterns. These circuits are then dried and fired to volatilize and burn out the liquid organic medium and sinter the metal particles.

Capital investment for the furnace can be decreased when precious metals such as gold, silver, and palladium are used as the conductor because these metals can be fired in air. Using precious metals, however, invites a sharp rise in material costs because precious metals are expensive.

Copper is widely used as a conductive component in semiconductor circuits and the like. Copper has the advantage of being less expensive than silver and other precious metals. However, copper cannot be fired in air because it oxidizes easily, and this increases capital investment because firing under a nitrogen atmosphere and the like is required.

Thus, in the process of forming an electrode using a conductive paste, the development of technology is needed that will satisfy the following requirements of: 1) enabling the use of inexpensive copper powder, 2) enabling firing to be performed in air, and 3) achieving low electrode resistance.

BRIEF SUMMARY OF THE INVENTION

Provided herein is a copper-containing (Cu-containing) conductive paste comprising: (a) about 10-95 wt % of a powder of coated Cu particles, and (b) about 0.1-15 wt % of a glass frit, dispersed in (c) an organic medium, with the total wt % of all components comprising the paste totaling to 100 wt %, and wherein, (i) the coated Cu particles are comprised of core Cu particles that are surface coated with germanium (Ge), and the content level of Ge is about 0.01-35 parts by weight, based on 100 parts by weight of the core Cu particles; and (ii) the organic medium is comprised of at least one organic polymer dissolved in at least one solvent.

In one embodiment of the Cu-containing conductive paste, the content level of Ge comprised in the coated Cu particles is about 0.1-30 parts by weight, based on the 100 parts by weight of the core Cu particles.

In a further embodiment of the Cu-containing conductive paste, the content level of Ge comprised in the coated Cu particles is about 0.2-25 parts by weight, based on the 100 parts by weight of the core Cu particles.

In a yet further embodiment of the Cu-containing conductive paste, the coated Cu particles further comprises boron (B) that are surface coated over the core Cu particles, and the content level of B is about 0-15 parts by weight, based on 100 parts by weight of the core Cu particles.

In a yet further embodiment of the Cu-containing conductive paste, the content level of B is about 0.05-10 parts by weight, based on 100 parts by weight of the core Cu particles.

In a yet further embodiment of the Cu-containing conductive paste, the content level of B is about 0.05-3 parts by weight, based on 100 parts by weight of the core Cu particles.

In a yet further embodiment of the Cu-containing conductive paste, the core Cu particles comprised in the coated Cu particles have a particle diameter (D50) of about 0.08-50 µm.

In a yet further embodiment of the Cu-containing conductive paste, the core Cu particles comprised in the coated Cu particles have a particle diameter (D50) of about 1-30 µm.

In a yet further embodiment of the Cu-containing conductive paste, the core Cu particles comprised in the coated Cu particles have a particle diameter (D50) of about 1-15 µm.

Further provided herein is an article comprising a structural element, wherein the structural element is comprised of a substrate and at least one Cu electrode, wherein the at least one Cu electrode is formed by: (I) applying a Cu-containing conductive paste onto one side of the substrate in a predetermined shape and at a predetermined position; (II) drying the Cu-containing conductive paste; and (III) firing the Cu-containing conductive paste to form the at least one Cu electrode, and wherein, the Cu-containing conductive paste comprises: (a) about 10-95 wt % of a powder of coated Cu particles and (b) about 0.1-15 wt % of a glass frit, dispersed in (c) an organic medium, with the total wt % of all components comprised in the paste totaling to 100 wt %, and wherein, (i) the coated Cu particles are comprised of core Cu particles that are surface coated with Ge, and the content level of Ge is about 0.01-35 parts by weight, based on 100 parts by weight of the core Cu particles; and (ii) the organic medium is comprised of at least one organic polymer dissolved in at least one solvent. In one embodiment, and during step (III), the Cu-containing conductive paste is fired in air. In a further embodiment, the article is an electronic article selected from the group consisting of displays, solar cells, capacitors, transistors, inductors, and resistive heater.

Yet further provided herein is a solar cell comprising a semiconductor substrate and at least one Cu electrode attached to a front or back side thereof, wherein the at least one Cu electrode is formed by: (I) applying a Cu-containing conductive paste onto the front or back side of the semiconductor substrate in a predetermined shape and at a predetermined position; (II) drying the Cu-containing conductive paste; and (III) firing the Cu-containing conductive paste to form the at least one Cu electrode, and wherein, the Cu-containing conductive paste comprises: (a) about 10-95 wt % of a powder of coated Cu particles and (b) about 0.1-15 wt % of a glass frit, dispersed in (c) an organic medium, with the total wt % of all components comprised in the paste totaling to 100 wt %, and wherein, (i) the coated Cu particles are comprised of core Cu particles that are surface coated with Ge, and the content level of Ge is about 0.01-35 parts by weight, based on 100 parts by weight of the core Cu particles; and (ii) the organic medium is comprised of at least one organic polymer dissolved in at least one solvent. In one embodiment, and during step (III), the Cu-containing conductive paste was fired in air. In a further embodiment, the semiconductor substrate is selected from the group consisting of single-crystal silicons, multicrystalline silicons. In a yet further embodiment of the solar cell, the at least one Cu electrode is formed on the front side of the semiconductor substrate and in the form of a multiple number of parallel conductive fingers and one or more front-side bus bars that are perpendicular to the conductive fingers. In a yet further embodiment of the solar cell, the at least one Cu electrode is formed on the back side of the semiconductor substrate and in the form of one or more back-side bus bars.

DETAILED DESCRIPTION OF THE INVENTION

Disclosed herein are copper-containing (Cu-containing) conductive pastes, copper (Cu) electrodes formed by firing the Cu-containing conductive paste over a substrate, and articles comprising a structural element with such Cu electrodes.

Cu-Containing Conductive Pastes

The Cu-containing conductive pastes disclosed herein contain inorganic powder such as powder of coated Cu particles and glass frits dispersed into an organic medium to form the "paste", which has suitable viscosity for applying on a substrate.

The glass frit includes fusible oxides, such as glass formers, intermediate oxides, and/or modifiers. The term "fusible," as used herein, refers to the ability of a material to become fluid upon heating, such as the heating employed in a firing operation. In some embodiments, the fusible material is composed of one or more fusible subcomponents. For example, the fusible material may comprise a glass material, or a mixture of two or more glass materials. Glass material in the form of a fine powder, e.g., as the result of a comminution operation, is often termed "frit" and is readily incorporated in the present paste composition. The glass frit may be crystalline, partially crystalline, amorphous, partially amorphous or combinations thereof.

As used herein, the term "glass" refers to a particulate solid form, such as an oxide or oxyfluoride, that is at least predominantly amorphous, meaning that short-range atomic order is preserved in the immediate vicinity of any selected atom, that is, in the first coordination shell, but dissipates at greater atomic-level distances (i.e., there is no long-range periodic order). Hence, the X-ray diffraction pattern of a fully amorphous material exhibits broad, diffuse peaks, and not the well-defined, narrow peaks of a crystalline material. In the latter, the regular spacing of characteristic crystallographic planes gives rise to the narrow peaks, whose position in reciprocal space is in accordance with Bragg's law. A glass material also does not show a substantial crystallization exotherm upon heating close to or above its glass transition temperature or softening point, Tg, which is defined as the second transition point seen in a differential thermal analysis (DTA) scan. In an embodiment, the softening point of glass material used in the present paste composition is in the range of 300 to 800° C.

It is also contemplated that some or all of the oxides in glass frits may be composed of material that exhibits some degree of crystallinity. For example, in some embodiments, a plurality of oxides are melted together, resulting in a material that is partially amorphous and partially crystalline. As would be recognized by a skilled person, such a material would produce an X-ray diffraction pattern having narrow, crystalline peaks superimposed on a pattern with broad, diffuse peaks. Alternatively, one or more constituents, or even substantially all of the fusible material, may be predominantly or even substantially fully crystalline. In an embodiment, crystalline material useful in the fusible material of the present paste composition may have a melting point of at most 800° C. In particular, the Cu-containing conductive paste disclosed herein comprises (i) a powder of coated Cu particles and (ii) a glass frit, dispersed in (iii) an organic medium. And the paste has suitable viscosity for applying on a substrate. The viscosity of the Cu-containing conductive paste may be about 0.05-5000 Pa-s at shear rate between about 0.2-350 $s^{-1}$. In certain embodiments, a viscosity of 5-800 Pa-s is preferred when screen printing is employed.

(i) Powder of Coated Cu Particles

The powder of coated Cu particles used herein is formed of particles of core Cu that are surface coated by a coating material comprising germanium (Ge). As for example, during a dry coating process, fine sized Ge powder (preferably nano-size particles) is attached to the surface of the core Cu particles and forms a thin coating layer. Alternatively, during a wet coating process, Ge colloids are coated to or grown on the surface of the core Cu particles followed by drying. Or, during a vacuum deposition process, Ge atoms are deposited over the surface of the core Cu particles. Preferably, the Ge coating layer has a thickness no greater than a micron, or no greater than 500 nanometers.

The core Cu can be pure Cu, or a Cu alloy with nickel, silver, aluminum, zinc, tin, silicon, iron, manganese, germanium, boron, or mixture thereof. Among them, Cu alloys with zinc, tin, aluminum, silicon, or mixtures thereof are preferred. The pure Cu can have purity of at least about 80% Cu in one embodiment, at least about 90% Cu in another embodiment, or at least about 95% Cu in yet another embodiment.

A skilled person would recognize that the choice of raw materials could unintentionally include impurities that may be incorporated into the Cu during processing. For example, the impurities may be present in the range of hundreds to thousands of parts per million. Impurities commonly occurring in industrial metals used herein are known to one of ordinary skill.

Particle diameter (D50) of the core Cu particles can be about 0.08-50 µm in one embodiment, about 0.5-30 µm in another embodiment, or about 0.5-15 µm in yet another embodiment. As used herein, "particle diameter (D50)" is intended to mean the 50% volume distribution size. The particle diameter (D50) may be obtained by measuring the distribution of the particle diameters using light scattering methods following, for example, ASTM B822-10.

The powder can be dispersed well in the organic medium when the particle diameter (D50) of the core Cu particles is in the disclosed range. And the conductive paste can be fired to form an electrode with certain conductivity when the particle diameter (D50) of the core Cu particles is in the disclosed range.

The core Cu used herein may be of any shape. For example, it can be spherical, flaky, or irregular in shape. When employing certain processes such as dry coating or melt coating process to prepare the coated Cu particles, the use of spherical core Cu can be advantageous.

The coated Cu particles may be coated by about 0.01-35 parts by weight, about 0.1-30 parts by weight, or about 0.2-25 parts by weight of Ge, based on 100 parts by weight of the core Cu.

In certain embodiments, the coating material used herein in coating the core Cu may further comprise boron (B).

The boron may be present in the coated Cu particles at a level of up to about 15 parts by weight, or about 0.05-10 parts by weight, or about 0.05-3 parts by weight, based on 100 parts by weight of the core Cu.

The Ge-containing coating material used herein in forming the coated Cu particles can be about 0.1-40 parts by weight in one embodiment, about 0.2-30 parts by weight in another embodiment, or about 0.4-25 parts by weight in yet another embodiment, based on 100 parts by weight of the core Cu. And the Ge-containing coating material is attached to and covers at least about 50%, or at least about 60%, or at least about 80% of the surface area of the core Cu particles. Also, the thickness of the Ge-containing coating layer over the core Cu particles may range from about 1-500 nm, or about 1-300 nm, or about 1-150 nm.

Particle diameter (D50) of the coated Cu particles can be about 0.08-50 μm in one embodiment, about 0.5-30 μm in another embodiment, or about 0.5-15 μm in yet another embodiment. The Cu-containing conductive paste can be dispersed well in the organic medium when the particle diameter of the coated Cu particles is in the disclosed range. Also, the particle diameter (D50) of the coated Cu particles should not be too large so that the processability of applying the Cu-containing paste over a substrate can be maintained. And the particle diameter (D50) of the coated Cu particles should not be too small so that the conductivity of the electrodes prepared therefrom will possess a certain high level of conductivity. The particle diameter (D50) can be measured in the same way as for the core Cu particles described above.

The coated Cu particles can be in a flaky form, a spherical form, or other irregular forms and mixtures thereof.

The powder of coated Cu can be present in the Cu-containing conductive paste at a level of about 10-95 wt %, or about 40-95 wt %, or about 60-95 wt %, based on the total weight of the Cu-containing conductive paste. The powder of coated Cu in the above range gives the electrode sufficient conductivity.

Besides the powder of coated Cu, any other additional metal powder can be added to the Cu-containing conductive paste. A powder of silver (Ag), gold (Au), palladium (Pd), aluminum (Al), platinum (Pt), nickel (Ni), tin (Sn) or mixtures or alloys of two or more of these metals can, for example, be added to the Cu-containing paste. In one embodiment, the Cu-containing conductive paste may include one or more of the following: Ag, Pt, Al, Ni, alloys of Ag and Pd, and alloys of Pt and Au, and such additional metals may be present in the Cu-containing conductive paste at a total content level of up to about 60 wt %, based on the total weight of the paste.

The coated Cu particles can be manufactured by any suitable process, for example, wet coating, dry coating, melt coating, encapsulation, vapor processing, plasma processing, or the combination of two or more of these techniques. The coating equipment includes fluidized-bed coater, spouted bed coater, wurster, rotating drum, pan and disc coater, fluidized bed reactor with chemical vapor deposition, and plasma enhanced chemical vapor deposition.

(ii) Glass Frit

Glass frit may serve several functions including to help sintering the conductive powder and to increase the adhesion of the electrode to the substrate. Complex oxides that could behave just like the glass frit in the firing also can be considered as the glass frit.

The glass frit used herein may be included in the Cu-containing conductive paste at a level of about 0.1-15 wt %, or about 0.2-10 wt %, or about 0.5-8 wt %, based on the total weight of the paste. With such amount, the glass frit can serve the function above. Particle diameter (D50) of the glass frit in the paste can be about 0.1-10 μm in one embodiment, about 0.3-6 μm in another embodiment, or about 0.6-4 μm in yet another embodiment. A uniform dispersion of glass frit within the paste can be obtained when particle diameter (D50) of the glass frit is maintained within the disclosed range. The particle diameter (D50) can be measured in the same way as for the core Cu particles described above.

The chemical composition of the glass frit used herein is not limited. Any glass frits can be suitable for use in the Cu-containing conductive paste. For example, a lead-boron-silicon glass frit or a lead-free bismuth glass frit like the bismuth-based oxide compositions disclosed in Table 1 of US 2012/0312368 can be used herein. The softening point of the glass frit can be about 300-800'C. When the softening point is in the disclosed range, the glass frit melts properly to obtain the effects mentioned above. The softening point can be determined by differential thermal analysis (DTA).

(iii) Organic Medium

The inorganic powders such as the powder of coated Cu and the glass frit are dispersed into the organic medium to form a viscous composition called "paste", having suitable viscosity for applying on a substrate with a desired pattern. Suitable organic media should have rheological properties that provide stable dispersion of solids, appropriate viscosity and thixotropy for applying the paste to a substrate, appropriate wettability on the substrate and the paste solids, good drying rate, and good firing properties.

There is no restriction on the composition of the organic medium used herein. The organic medium used herein may be a solution comprised of at least one organic polymer dissolved in at least one solvent.

A wide variety of organic polymers can be used herein, for example, sugar, starch, cellulose, wood rosin, epoxy resin, phenolic resin, acrylic resin, polyacrylates, polyesters, polylactones, phenoxy resins, or a mixture of two or more thereof. Of these, celluloses are preferred, which include, without limitation, ethyl cellulose, cellulose nitrate, hydroxyethyl cellulose, ethylhydroxyethyl cellulose, carboxymethyl cellulose, hydroxypropyl cellulose, and mixtures and derivatives thereof.

Suitable solvents may include, without limitation, terpenes (e.g., alpha- or beta-terpineol), kerosene, dibutylphthalate, butyl carbitol, butyl carbitol acetate, hexylene glycol, alcohols with boiling points above 150° C., alcohol esters, bis(2-(2-butoxyethoxy)ethyl adipate, dibasic esters, octyl epoxy tallate, isotetradecanol, pentaerythritol ester of hydrogenated rosin, and mixtures thereof. The solvents can also include volatile liquids to promote rapid hardening after application of the paste on a substrate.

The organic medium may further contain thickeners, stabilizers, surfactants, and/or other common additives to improve the performance of the paste, such as better printability, better dispersion, and/or better stability.

The optimal amount of the organic medium in the Cu-containing conductive paste is dependent on the method of applying the paste and the specific organic medium used. Typically, the Cu-containing conductive paste disclosed herein may contain about 3-70 wt %, or about 3-65 wt %, or about 5-58 wt % of the organic medium, based the total weight of the paste.

(iv) Additional Inorganic Powder

Additional inorganic powder can be optionally added to the Cu-containing conductive paste. The additional inorganic powder is not essential. However, the additional inorganic powder can improve various properties of the electrode, such as adhesion and conductivity.

In one embodiment, the additional inorganic powders used herein may be selected from metals, metal oxides, or mixtures thereof. Exemplary metals used herein may be selected from Zn, Gd, Ce, Zr, Ti, Mn, Sn, Ru, Co, Fe, Cr, or mixtures of two or more thereof. Exemplary metal oxides used herein may be one or more oxides of Zn, Gd, Ce, Zr, Ti, Mn, Sn, Ru, Co, Fe, or Cr. The metal oxides used herein also include any compounds that can generate the metal oxides, as described above, upon firing.

The additional inorganic powder can be present in the Cu-containing conductive paste at a level of about 0.05-10 wt % in one embodiment, about 0.1-7 wt % in another embodiment, or about 0.2-6 wt % in yet another embodiment, based on the total weight of the paste.

The particle diameter (D50) of the additional inorganic powder is not subject to any particular limitation, although an average particle size of no more than about 10 μm, and preferably no more than about 5 μm, is desirable.

The Cu-containing conductive paste disclosed herein may be formed by any suitable mixing process. For example, the paste may be prepared by simply mixing and dispersing the powder of coated Cu particles, glass frits, and the optional other inorganic particles in the organic medium.

Cu Electrodes and Methods of Manufacturing the Same

The Cu electrode is formed by, first, applying (e.g., dispensing, casting, coating, or printing) the Cu-containing conductive paste onto the surface of a substrate in a predetermined shape and at a predetermined position, drying the Cu-containing conductive paste at an elevated temperature (e.g., about 70-240° C.) for a certain duration (e.g., about 2-20 min) to partially remove the organic medium, and then, firing the Cu-containing conductive paste to remove the residual organic medium and sinter the coated Cu particles with the glass frit and the other inorganic materials comprising the paste.

There is no restriction on the substrate. The substrate material can be selected from glass, ceramics, semiconductors, metal, or other materials that can sustain the high temperature during firing. When the substrate is a metal substrate or a semiconductor substrate, an insulating layer may be formed on the side on which the electrode is formed.

The way of applying the Cu-containing conductive paste on the substrate is not limited and any suitable process can be used herein. Exemplary application processes useful herein include, without limitation, dispensing, screen printing, ink-jet printing, casting, spraying, gravure printing, flexo printing, stencil printing, nozzle dispensing, syringe dispensing, plating, extrusion, multiple printing, or offset printing, direct writing, and the like. In particular, screen printing is often used as it is cost effective. Also, when screen printing is used, the Cu-containing conductive paste can be applied on the substrate in a relatively short time. The pattern of the Cu-containing conductive paste on the substrate can be any desired electrode pattern such as line(s), circle, or square.

The Cu-containing conductive paste that is applied over the substrate can be optionally dried for, for example, about 2-20 minutes at about 70° C.-250° C. in an oven. The drying process may be carried out at a modest temperature to harden the paste by removing its most volatile organics.

The Cu-containing conductive paste on the substrate is then fired in any atmosphere. A furnace set with a predetermined temperature and time profile can be used herein.

The powder of coated Cu sinters during firing to become the electrode that has a sufficient conductivity. The organic medium is removed by being burned off and/or carbonized during firing.

Firing may be carried out in an atmosphere composed of nitrogen, argon, or any other inert gas, or an oxygen-containing mixture such as air, or a mixed gas of oxygen and nitrogen. In one embodiment of the present disclosure, the Cu-containing conductive paste on the substrate is fired in air. The term, "firing in air" or "air firing", essentially refers to firing without replacing the atmosphere in the firing space with a gas containing no oxygen or less oxygen than the surrounding atmosphere around the firing space. In an embodiment, the air surrounding the firing equipment is used as the firing atmosphere without replacing the firing atmosphere with other gas.

The firing condition can vary depending on substrate type, properties of the Cu-containing conductive paste, or the pattern of the Cu-containing conductive paste on the substrate. However, the electrode can be generally obtained by firing the Cu-containing conductive paste at a setting peak temperature of about 400-1200° C. and for a firing time of about 5 seconds to about 3 hours. The setting peak temperature can be about 500-1100° C. in one embodiment, or about 550-1000'C in another embodiment. The firing time can be about 10 seconds to about 2 hours in one embodiment, or about 30 seconds to about 1.5 hours in another embodiment. The firing condition can be adjusted by taking into consideration the firing temperature and the firing time. For example, the Cu-containing conductive paste can be fired at a high temperature for a short time or low temperature for a long time when the substrate is easily damaged by the high temperature.

For certain applications, after firing, the paste-bearing substrate may need to be placed in a cooling device to cool down slowly.

In an embodiment, the firing is accomplished by passing the substrate bearing the printed paste pattern through a belt furnace at high transport rates, for example between about 2.5-760 cm/min, with firing time from about 10 seconds to about 3 hours. The firing time employed herein is the time from starting to ending of firing. In certain embodiments, the paste-bearing substrate is first dried before entering a belt furnace, fired while passing through the belt furnace, and then cooled down after exiting the belt furnace. In such embodiments, the firing time is the time from the entrance to the exit of the furnace. Multiple temperature zones may be set for the belt furnace to control the desired thermal profile, and the number of zones may vary, for example, from 3 to 11 zones. The firing temperature in a belt furnace is conventionally specified by the furnace set point in the hottest zone of the furnace, but it is known that the peak temperature attained by the passing substrate in such a process is somewhat lower than the highest set point. Other batch and continuous rapid fire furnace designs known to one of skill in the art are also contemplated.

Electrodes are formed over the substrates after the firing. The average width of the electrode can be about 10 μm to 100 mm in one embodiment, about 30 μm to 70 mm in another embodiment, or about 50 μm to 50 mm in yet another embodiment, and the average thickness can be about 1-200 μm in one embodiment, about 1-100 μm in another embodiment, or about 1-50 μm in yet another embodiment. In those embodiments wherein the electrodes are used in solar cells, the average width of the electrodes may be about 10 μm to 10 mm in one embodiment, about 30 μm to 7 mm in another embodiment, or about 50 μm to 5 mm in yet another embodiment.

As demonstrated by the below examples, by replacing the more expensive Ag particles with the less expensive coated Cu particles (as disclosed herein) in the conductive paste, not only is the material cost very much reduced, but the paste can be fired in air and electrodes so obtained possess low resistivity. In particular, the resistivity of the electrodes so obtained ranges from about 3E-06 to about 5E-02 ohm-cm, or preferably from about 3E-06 to about 2E-04 ohm-cm.

Without being bound by any particular theory, it is believed that when Ge coats the surface of the core Cu particles, it reduces oxidation of the Cu powder during firing in air. The Ge coating also may accelerate the sintering of the inorganic materials comprised in the Cu-containing conductive paste. Consequently, the resistivity of the electrodes derived from such paste is reduced.

Articles Comprising Structural Elements with the Cu Electrodes

Further disclosed herein are articles that comprise a structural element and the structural element is comprised of a substrate and Cu electrodes (described above) formed thereon. The articles disclosed herein include, without limitation, displays, solar cells, capacitors, transistors, inductors, resistive heater, and the like.

In one embodiment, the article is a solar cell comprising a semiconductor substrate and Cu electrodes formed thereon. The semiconductor substrates include, without limitation, single-crystal silicon, multicrystalline silicon and the like.

The semiconductor substrates used herein may be doped with phosphorus and boron to form a p/n junction. The semiconductor substrates also vary in size (length×width) and thickness. As an example, the thickness of the semiconductor substrate used herein may be about 50-500 μm, about 100-300 μm, or about 140-200 μm. The length and width of the semiconductor substrate may each be about 100-250 mm, about 125-200 mm, or about 125-156 mm.

Figure 2A:
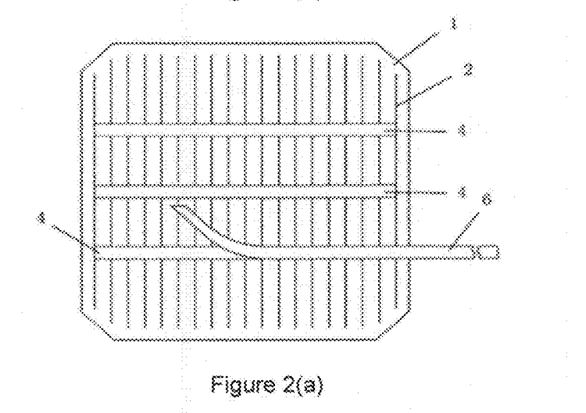
FIG. 2(a) is a planar view of the front surface of a solar cell.
Figure 2B:
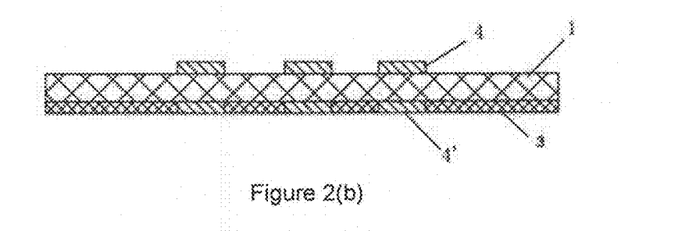
FIGS. 2(b) and 2(c) are cross-sectional views of solar cells with different designs of back-side electrodes.
Figure 2C:
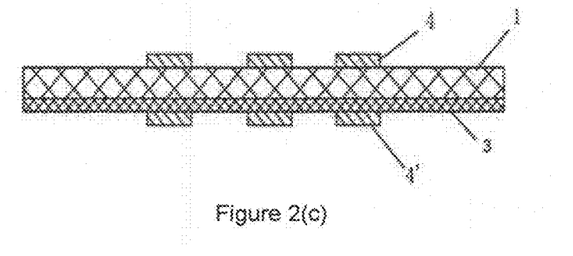

The semiconductor substrates of solar cells typically have a front side and a back side, wherein the front side of the semiconductor substrates faces to a light source when in use. And the Cu-containing conductive paste disclosed herein can be used herein to form the Cu electrodes on the front and/or back sides of the semiconductor substrates. And as illustrated in FIG. 2(a)-2(c), the front-side electrodes may be formed of a multiple number of parallel conductive fingers (2) and one or more front-side bus bars (4) that are perpendicular to the conductive fingers (2), while the back-side electrodes are formed of at least one back-side bus bar (4') and Al paste (3). The back-side bus bars (4') are also called tabbings and are typically positioned in the mirror positions of the front-side bus bars (4).

Typically, an anti-reflection coating and/or insulation coating may be formed on the front side of the semiconductor substrate of the solar cell. Exemplary anti-refection coating or insulation coating materials used herein, include without limitation, silicon nitride, silicon oxide, titanium oxide, SiNx:H, hydrogenated amorphous silicon nitride, and silicon oxide/titanium oxide. The coating can be formed by plasma enhanced chemical vapor deposition (PECVD), CVD, and/or other known techniques known. Therefore, when preparing the front-side electrodes on the semiconductor substrates, the Cu-containing conductive paste disclosed herein is applied over the anti-reflective coating and/or insulation coating on the semiconductor substrate, by a variety of methods as described above, in a predetermined pattern and shape and at a predetermined position.

In one embodiment, the front-side bus bar(s) (4) of the semiconductor substrate are formed of the Cu electrodes disclosed herein. The front-side bus bars (4) may be in the form of continuous or discontinuous lines across the front surface. And the front-side bus bars (4) may have a width of about 0.5-4 mm or about 1-2 mm and a thickness of about 2-40 μm, about 2-30 μm, or about 3-20 μm. In addition, the front-side conductive fingers (2) also may be formed of the Cu electrodes disclosed herein. And each of the conductive fingers (2) may have a width of about 20-200 μm, about 30-150 μm, or about 30-100 μm and a thickness of about 3-100 μm, about 3-50 μm, or about 5-30 μm. In forming the front-side bus bar(s) (4) and/or conductive fingers (2), the Cu-containing conductive paste disclosed herein is first applied (e.g., screen printed) over the front surface of the semiconductor substrate in a predetermined pattern, shape, and position that corresponds to the front-side bus bars (4) and/or conductive fingers (2) of the semiconductor substrate, and then dried, for example, for about 0.5-10 min, during which time the volatile solvents of the organic medium are removed or partially removed. The dried paste is then fired by heating to a maximum temperature of about 500° C.-1000° C. for about 1 sec to 2 min. The firing may be carried out in any atmosphere, preferably, in air. During firing, the glass frit in the fired Cu electrodes (e.g., the conductive fingers and optionally the front-side bus bars) react with the anti-reflective coating and/or insulation coating, thereby making electrical contact and/or mechanical adhesion with the semiconductor substrate.

In addition, the Cu-containing conductive paste may be used in forming the back-side bus bars (4') of the semiconductor substrate of the solar cell. The back-side bus bar(s) (4') also may be in the form of continuous or discontinuous lines across the back surface. And the back-side bus bars (4') may have a width of about 0.5-5 mm or about 1-4 mm and a thickness of about 2-40 μm, about 2-30 μm, or about 3-20 μm. The Cu-containing conductive paste disclosed herein is applied over the back side of the semiconductor substrate in a predetermined pattern and shape, and at a predetermined position. The predetermined pattern, shape, and position correspond to the back-side bus bars (4') of the semiconductor substrate. In one embodiment, other conductive materials containing aluminum or aluminum and silver are applied over the back surface of the semiconductor substrate, which is not covered by the Cu-containing conductive paste (corresponding to the Al paste (3) on FIG. 2(b)). While in other embodiments, other conductive materials containing aluminum or aluminum and silver are applied over the entire back surface of the semiconductor substrate prior to the application of the Cu-containing conductive paste (corresponding to the Al paste (3) in FIG. 2(c)). In such embodiments, the Cu-containing conductive paste is applied over the coating formed of the other conductive materials. Thereafter, the paste bearing semiconductor substrate is subject to firing in any atmosphere, preferably, in air, to form the back-side electrodes.

In practice, the front electrodes and the back electrodes of the semiconductor substrate may be formed sequentially or simultaneously. When the front electrodes and back electrodes are formed simultaneously, conductive pastes are first applied and dried over a first side of the substrate, then conductive pastes are applied and dried over a second side of the substrate, and finally, the paste bearing substrate is fired in any suitable atmosphere, or preferably in air. Cu electrodes may thus be formed on both sides of the semiconductor substrates.

EXAMPLES

Conductive Particles:

In forming the Cu-containing conductive paste used in the examples, the following inorganic powders were used:

TABLE 1

| Cu | D50 (μm) |
|---|---|
| Cu-1 | 0.78 |
| Cu-2 | 3.6 |
| Cu-3 | 5.4 |
| Cu-4 | 8.3 |

| Cu mixed with Ge | D50 of Cu (μm) | Cu:Ge (by weight) |
|---|---|---|
| Cu—Ge-1 | 0.78 | 100:5 |
| Cu—Ge-2 | 3.6 | 100:5 |
| Cu—Ge-3 | 5.4 | 100:5 |
| Cu—Ge-4 | 5.4 | 100:8 |
| Cu—Ge-5 | 8.3 | 100:5 |
| Cu—Ge-6 | 5.4 | 100:20 |

| Cu mixed with Ge and B | D50 of Cu (μm) | Cu:Ge:B (by weight) |
|---|---|---|
| Cu—Ge-B-1 | 5.4 | 100:5:1 |
| Cu—Ge-B-2 | 5.4 | 100:8:1 |

| Cu Coated with Ag | D50 of Cu (μm) | Cu:Ag (by weight) |
|---|---|---|
| *Cu/Ag | 3.5 | 80:20 |

| Cu Coated with Ge | D50 of Cu (μm) | Cu:Ge (by weight) |
|---|---|---|
| Cu/Ge-1 | 5.4 | 100:2 |
| Cu/Ge-2 | 5.4 | 100:5 |
| Cu/Ge-3 | 5.4 | 100:8 |
| Cu/Ge-4 | 5.4 | 100:20 |
| Cu/Ge-5 | 0.78 | 100:5 |
| Cu/Ge-6 | 3.6 | 100:5 |
| Cu/Ge-7 | 8.3 | 100:5 |
| Cu/Ge-8 | 5.4 | 100:4 |
| Cu/Ge-9 | 5.4 | 100:6 |
| Cu/Ge-10 | 5.4 | 100:6.7 |

| Cu Coated with Ge and B | D50 of Cu (μm) | Cu:Ge:B (by weight) |
|---|---|---|
| Cu/Ge-B-1 | 5.4 | 100:5:0.5 |
| Cu/Ge-B-2 | 5.4 | 100.5:1 |
| Cu/Ge-B-3 | 5.4 | 100:5:8 |
| Cu/Ge-B-4 | 5.4 | 100:8:1 |
| Cu/Ge-B-5 | 5.4 | 100:4:1 |
| Cu/Ge-B-6 | 5.4 | 100:6:1 |
| Cu/Ge-B-7 | 5.4 | 100:2:0.1 |
| Cu/Ge-B-8 | 5.4 | 100:2:2 |
| Cu/Ge-B-9 | 5.4 | 100:5:4 |

Notes:
All copper (Cu) powders used herein were purchased from Mitsui Mining & Smelting Co., Ltd. (Japan);
All germanium (Ge) nanoparticles used herein were those with D50 of 70-120 nm and purchased from Forsman Scientific (Beijing) Co., Ltd. (China);
All boron (B) nanoparticles used herein were those with D50 of 100 nm and purchased from Beijing Dk nano S&T Ltd. (China);
*The powder of Cu/Ag was purchased from Ningbo Guangbo New Nanomaterials Stock Co., Ltd. (China) with D50 of 3.5 μm;

The powders of coated Cu (listed in Table 1, above) were prepared using a drying coating process in an oxygen-free environment with the rotor speed set at 3000-6000 rpm and duration at 3 minutes.

Figures 1A, 1B, 1C:
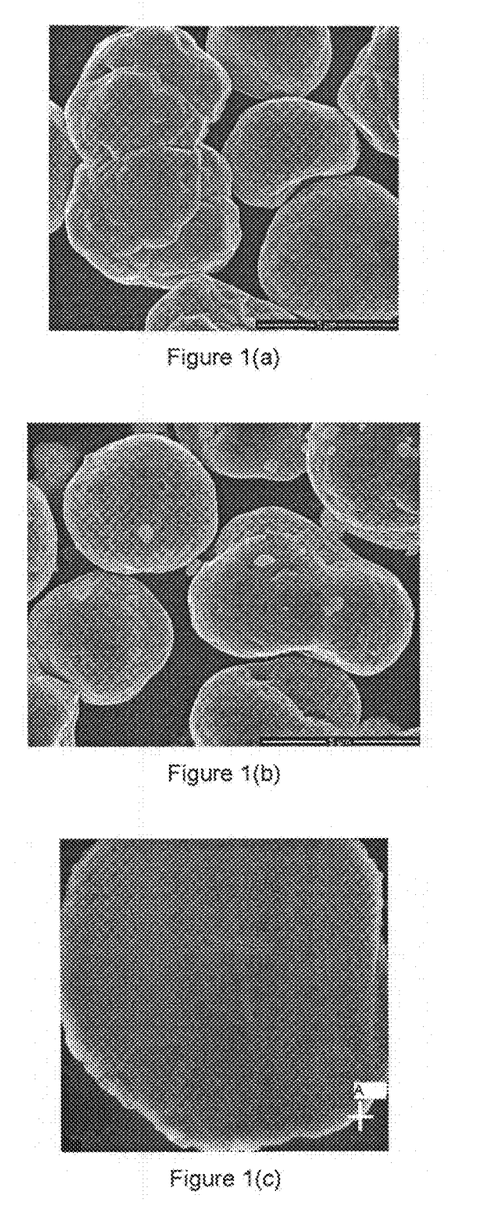
FIG. 1(a) is a scanning electron microscopy (SEM) image of uncoated Cu particles.
FIG. 1(b) is a SEM image of coated Cu particles.
FIGS. 1(c) and 1(d) are SEM images of the cross section of a coated Cu particle.
Figure 1D:
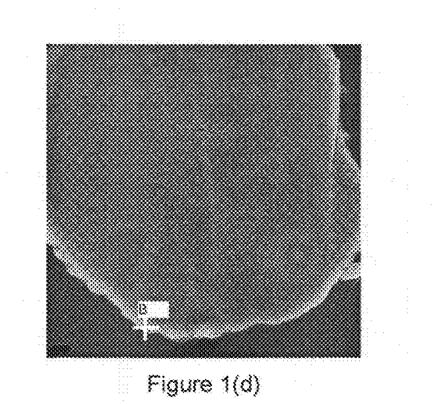

FIGS. 1(a) and 1(b) are scanning electron microscopy (SEM) images of uncoated Cu particles (Cu-3) and coated Cu particles (Cu/Ge-3), respectively. FIG. 1(c) is a SEM image of the cross section of coated Cu particles (Cu/Ge-3). The test sample for the cross-sectional SEM image was prepared by mixing Cu/Ge-3 particles with epoxy resin followed by thermal curing and ion beam cross-section polishing. Further, using energy dispersive X-ray spectroscopy (EDS), a Cu/G-3 particle was randomly picked and element analysis was conducted on two randomly chosen spots, A and B, on the surface of the particle (FIGS. 1(c) and 1(d)) and the results are tabulated in Table 2. The results demonstrate the difference in surface morphology for uncoated and coated Cu particles. In particular, the uncoated Cu particles typically have smooth surfaces (see FIG. 1(a)), while the coated Cu particles have roughened surfaces (see FIG. 1(b)). Also, as demonstrated by FIGS. 1(c)-1(d) and Table 2, core Cu particles were successfully coated by Ge in Cu/Ge-3 particles.

TABLE 2

| Element | Spot A | Spot B |
|---|---|---|
| C (wt %) | 17.73 | 22.28 |
| O (wt %) | 02.07 | 02.60 |
| Ge (wt %) | 01.82 | 06.53 |
| Cu (wt %) | 78.38 | 68.59 |

Comparative Examples CE1-CE10 and Examples E1-E15

In each of CE1-CE10 and E1-E15, a thick film paste was prepared as follows: 8.3 g inorganic powder (as listed in Table 3 for each sample), 0.29 g Bi—Zn—B—Al—Ba—Si oxide glass frit similar to the bismuth-based oxide compositions disclosed in Table 1 of US 2012/0312368 (with D50 of 0.8 μm), 0.02 g hydrogenated castor oil, 1.1 g a solution comprised of 10-20 wt % ethyl cellulose dissolved in terpineol, and 0.29 g 2,2,4-trimethyl-1,3-pentanediol monoisobutyrate were mixed in a mixer (manufactured by Thinky USA Inc. (U.S.A.) with the model name ARE-310) at 2000 rpm for 1 min, followed by grinding for 5 min by hand.

In each sample, and using a stencil, the thick film paste prepared above was cast on the front surface of a silicon cell (silicon nitride coated 6" silicon wafer (180 μm thick) obtained from JA Solar Holdings Co. Ltd) to form a 30 μm thick line of paste layer (2 mm wide and 30 mm long). The silicon cell was used as a substrate to support the paste. The paste layer was then dried at 100° C. for 5-10 min. The dried paste was fired in air using an IR furnace (manufactured by Despatch Instruments (P. R. C.) with the model name CF-7210). The temperature profile of the IR furnace was set at 580-610-630-650-820-900° C. and the belt speed was at about 560 cm/min. Electrodes on the silicon cell were then obtained.

The sheet resistance of the electrode on the surface of the silicon cell was measured by a four-probe method using a sheet resistivity meter (manufactured by Napson Corp. (Japan) with the model name RT3000/RG7) and the thickness of the electrode was measured using a Veeco Surface Profiler (manufactured by Veeco Instruments Inc. with the model name Dektak 150). The resistivity of the electrode was calculated by the equation below and tabulated in Table 3:

$$\rho(\text{Resistivity}) = \text{sheet resistance} \times \text{thickness} \times \text{geometry correction}$$
$$= \text{sheet resistance} \times \text{thickness} \times 1.9475/4.5324$$

The results demonstrate that when uncoated Cu was used in the thick film paste (CE1), the electrodes prepared therefrom had very high resistivity. When powders of Cu particles that were surface coated with Ag was used in the thick film paste (CE10), the electrodes prepared therefrom still had very high resistivity. However, it was found that when Ge and optionally B was added in the thick film paste, in addition to the uncoated Cu (CE2-CE9), the resistivity of the electrodes prepared from such thick film pastes were decreased dramatically. Even more surprisingly, it was further found that when Ge, and optionally Ge and B, was attached to the surface of the Cu particles and such coated Cu particles were used in the thick film paste (E1-E15), the resistivity of the electrodes prepared from such thick film pastes were further reduced. Moreover, when comparing E2 and E3 over E1 or E10 and E11 over E6, a further benefit of coating both Ge and B on the surface of the Cu particles was shown. That is, when Cu particles were coated by a mixture of Ge and B, and such coated Cu particles were used in the thick film paste (E2-E3 and E10-E11), the resistivities of the electrodes prepared from such thick film pastes were further reduced.

TABLE 3

| Samples | Inorganic Powder Type | D50 of Cu (μm) | Cu:Ge:B (by weight) | Resistivity (ohm-cm) |
|---|---|---|---|---|
| CE1 | Cu | 5.4 | 100:0:0 | 9.37E+02 |
| E1 | Cu/Ge-1 | 5.4 | 100:2:0 | 8.94E−05 |
| E2 | Cu/Ge-B-7 | 5.4 | 100:2:0.1 | 2.96E−05 |
| E3 | Cu/Ge-B-8 | 5.4 | 100:2:2 | 2.07E−05 |
| E4 | Cu/Ge-5 | 0.78 | 100:5:0 | 4.51E−02 |
| CE2 | Cu—Ge-1 | 0.78 | 100:5:0 | 3.60E+02 |
| E5 | Cu/Ge-6 | 3.6 | 100:5:0 | 1.74E−05 |
| CE3 | Cu—Ge-2 | 3.6 | 100:5:0 | 1.08E−04 |
| E6 | Cu/Ge-2 | 5.4 | 100:5:0 | 2.30E−05 |
| CE4 | Cu—Ge-3 | 5.4 | 100:5:0 | 3.37E−05 |
| E7 | Cu/Ge-3 | 5.4 | 100:8:0 | 1.67E−05 |
| CE5 | Cu—Ge-4 | 5.4 | 100:8:0 | 3.30E−05 |
| E8 | Cu/Ge-4 | 5.4 | 100:20 | 1.45E−04 |
| CE6 | Cu—Ge-6 | 5.4 | 100:20 | 1.73E−04 |
| E9 | Cu/Ge-7 | 8.3 | 100:5:0 | 1.34E−05 |
| CE7 | Cu—Ge-5 | 8.3 | 100:5:0 | 5.24E−05 |
| E10 | Cu/Ge-B-1 | 5.4 | 100:5:0.5 | 1.34E−05 |
| E11 | Cu/Ge-B-2 | 5.4 | 100:5:1 | 1.13E−05 |
| *E12 | Cu/Ge-B-2 | 5.4 | 100:5:1 | 7.62E−06 |
| CE8 | Cu/Ge-B-1 | 5.4 | 100:5:1 | 2.13E−05 |
| E13 | Cu/Ge-B-9 | 5.4 | 100:5:4 | 3.67E−5 |
| E14 | Cu/Ge-B-3 | 5.4 | 100:5:8 | 6.66E−05 |
| E15 | Cu/Ge-B-4 | 5.4 | 100:8:1 | 1.67E−05 |
| CE9 | Cu—Ge-B-2 | 5.4 | 100:8:1 | 2.28E−05 |
| CE10 | Cu/Ag | 3.5 | — | 4.98E+02 |

Notes:
*For E12, the temperature profile of the IR furnace was set at 580-610-630-650-820-1000° C. and belt speed at about 660 cm/min.

Examples E16-E19

In the same way as described for E1, in each of E16-E19, a thick film paste was prepared and the thick film paste as so prepared was fired over a silicon cell to form an electrode. During the firing process, the temperature profile was set at 580-610-630-650-700-700° C. and belt speed was set at 127 cm/min or 254 cm/min. The resistivity of the electrode was determined and tabulated in Table 4. In E16 and E18, the coated Cu particles were coated with Ge, while in E17 and E19, the coated Cu particles were coated with Ge and B. As demonstrated, the addition of B in the coating material further reduced the resistivity of the electrodes prepared therefrom. Further, such effect is even more obvious at lower belt speed, i.e., when longer firing time was employed.

TABLE 4

| | Powder | | | Resistivity (ohm-cm) | |
|---|---|---|---|---|---|
| | | | | Belt | Belt |
| | Type | D50 of Cu (μm) | Cu:Ge:B (by weight) | Speed @ 127 cm/min | Speed @ 254 cm/min |
| E16 | Cu/Ge-8 | 5.4 | 100:4:0 | 1.25E−03 | 1.36E−04 |
| E17 | Cu/Ge-B-5 | 5.4 | 100:4:1 | 3.96E−05 | 4.81E−05 |
| E18 | Cu/Ge-9 | 5.4 | 100:6:0 | 2.83E−04 | 1.34E−04 |
| E19 | Cu/Ge-B-6 | 5.4 | 100:6:1 | 3.10E−05 | 6.14E−05 |

Comparative Example CE11 and Examples E20-E21

FIG. 2 illustrates a solar cell with electrodes. FIG. 2(a) shows the front surface of a solar cell (1). The front electrodes of the solar cell (1) are formed of a multiple number of fingers (2) that are parallel to each other and three front-side bus bars (4) that are perpendicular to the fingers (2). In addition, ribbons (6) can be later electrically bonded (e.g., soldered) over the bus bars (4). FIG. 2(b) is a cross-sectional view of the solar cell (1) with electrodes. As shown in FIG. 2(b), the back electrodes are formed of three back-side bus bars (4') which are in mirror position of the front-side bus bars (4) and an Al paste (3) covers the entire area of the back surface of the solar cell (1) (except the areas that are covered by the three back-side bus bars (4')).

In CE11 (as shown in FIG. 2(b)), the electrodes of a silicon cell were prepared as follows. First, DuPont™ Solamet® PV17F photovoltaic metallization front side silver paste (obtained from E.I. du Pont de Nemours and Company (U.S.A.), hereafter "DuPont") was screen printed over the front surface of the silicon cell in the position of conductive fingers (2) and front-side bus bars (4), followed by drying at 240'C for 3 min. Then, DuPont™ Solamet® PV505 photovoltaic metallization back side silver paste (obtained from DuPont) was screen printed over the back surface of the silicon cell in the position of back-side bus bars (4'), followed by drying at 240'C for 3 min, and Al paste PV35A (obtained from DuPont) was screen printed over the backside of the silicon cell (except the area that were covered by the back side silver paste), followed by drying at 240° C. for 3 min. Finally, the silicon cell was fired in air using an IR furnace. The temperature profile of the IR furnace was set at 580-610-630-650-800-900° C. and the belt speed was at 560 cm/min. The Voc (open circuit voltage), Rs (series resistance), Rsh (shunt resistance), FF (fill factor), and Eff (cell efficiency) values of the solar cell as obtained above were measured on Burger IV tester (manufactured by Berger Lichttechnik GmbH & Co. (Germany), model name Berger Pulsed Solar Simulator) and the results are tabulated in Table 5.

For E20 and E21, a Cu-containing conductive paste was prepared as follows: 150 g powder of coated Cu (Cu/Ge-10), 6 g glass frit, 1 g hydrogenated castor oil, 0.2 g caprylic acid, and 42.8 g a solution comprised of 10-20 wt % ethyl cellulose dissolved in terpineol were mixed in a mixer at 2000 rpm for 1 min; and the final Cu-containing conductive paste was obtained by passing the mixture through a three-roller machine (manufactured by EXAKT Technologies, Inc. with the model name EXAKT 50) twice.

In E20 (as shown in FIG. 2(b)), in a similar way for CE11, a solar cell with front-side and back-side electrodes was obtained, with the exception that the Cu-containing conductive paste as prepared above was used in place of DuPont™ Solamet® PV505 photovoltaic metallization back side silver paste to form the back-side bus bars.

In E21 (as shown in FIG. 2(c)), the electrodes of a silicon cell were prepared as follows. First, DuPont™ Solamet® PV17F photovoltaic metallization front side silver paste was screen printed over the front surface of the silicon cell in the position of fingers (2) and front-side bus bars (4), followed by drying at 240° C. for 3 min. The Cu-containing conductive paste as prepared above was screen printed in the position of the back-side bus bars (4'), followed by drying at 240° C. for 3 min. And Al paste PV35A was screen printed over the entire surface of the backside of the silicon cell (except the area that was covered by the Cu-containing conductive paste), followed by drying at 240° C. for 3 min. Finally, the silicon cell was fired in air using an IR furnace. Again, the temperature profile of the IR furnace was set at 580-610-630-650-800-900° C. and the belt speed was at 560 cm/min. The Voc, Rs, Rsh, FF, and Eff values of the solar cell as obtained above were measured on Burger IV tester and the results are tabulated in Table 5. As demonstrated herein, by replacing the more expensive Ag-containing paste (CE11) with the less expensive Cu-containing paste (as disclosed herein, E20 and E21) in forming the back-side bus bars, the cell efficiency was maintained.

TABLE 5

|  | Voc | Rs | Rsh | FF (%) | Eff (%) |
|---|---|---|---|---|---|
| CE11 | 0.630 | 0.00241 | 337.1 | 79.39 | 18.0 |
| E20 | 0.629 | 0.00238 | 129.8 | 78.31 | 17.8 |
| E21 | 0.633 | 0.00267 | 341.1 | 79.24 | 18.1 |

What is claimed is:

1. A copper-containing (Cu-containing) conductive paste comprising:
    a) about 10-95 wt % of a powder of coated Cu particles, and
    b) about 0.1-15 wt % of a glass frit, dispersed in
    c) an organic medium,
with the total wt % of all components comprising the paste totaling to 100 wt %, and wherein, (i) the coated Cu particles are comprised of core Cu particles that are surface coated with germanium (Ge), and the content level of Ge is about 0.01-35 parts by weight, based on 100 parts by weight of the core Cu particles; and (ii) the organic medium is comprised of at least one organic polymer dissolved in at least one solvent.

2. The Cu-containing conductive paste of claim 1, wherein, the content level of Ge comprised in the coated Cu particles is about 0.1-30 parts by weight, based on the 100 parts by weight of the core Cu particles.

3. The Cu-containing conductive paste of claim 2, wherein, the content level of Ge comprised in the coated Cu particles is about 0.2-25 parts by weight, based on the 100 parts by weight of the core Cu particles.

4. The Cu-containing conductive paste of claim 1, wherein the coated Cu particles further comprises boron (B) that are surface coated over the core Cu particles, and the content level of B is about 0-15 parts by weight, based on 100 parts by weight of the core Cu particles.

5. The Cu-containing conductive paste of claim 4, wherein the content level of B is about 0.05-10 parts by weight, based on 100 parts by weight of the core Cu particles.

6. The Cu-containing conductive paste of claim 5, wherein the content level of B is about 0.05-3 parts by weight, based on 100 parts by weight of the core Cu particles.

7. The Cu-containing conductive paste of claim 1, wherein, the core Cu particles comprised in the coated Cu particles have a particle diameter (D50) of about 0.08-50 µm.

8. The Cu-containing conductive paste of claim 7, wherein, the core Cu particles comprised in the coated Cu particles have a particle diameter (D50) of about 1-30 µm.

9. The Cu-containing conductive paste of claim 8, wherein, the core Cu particles comprised in the coated Cu particles have a particle diameter (D50) of about 1-15 µm.

10. An article comprising a structural element, wherein the structural element is comprised of a substrate and at least one Cu electrode, wherein the at least one Cu electrode is formed by: (I) applying a Cu-containing conductive paste onto one side of the substrate in a predetermined shape and at a predetermined position; (II) drying the Cu-containing conductive paste; and (III) firing the Cu-containing conductive paste to form the at least one Cu electrode,
wherein, the Cu-containing conductive paste comprises:
    a) about 10-95 wt % of a powder of coated Cu particles and
    b) about 0.1-15 wt % of a glass frit, dispersed in
    c) an organic medium,
    with the total wt % of all components comprised in the paste totaling to 100 wt %, and wherein, (i) the coated Cu particles are comprised of core Cu particles that are surface coated with Ge, and the content level of Ge is about 0.01-35 parts by weight, based on 100 parts by weight of the core Cu particles; and (ii) the organic medium is comprised of at least one organic polymer dissolved in at least one solvent.

11. The article of claim 10, wherein, during step (III), the Cu-containing conductive paste is fired in air.

12. The article of claim 11, wherein the article is an electronic article selected from the group consisting of displays, solar cells, capacitors, transistors, inductors, and resistive heater.

13. A solar cell comprising a semiconductor substrate and at least one Cu electrode attached to a front or back side thereof, wherein the at least one Cu electrode is formed by: (I) applying a Cu-containing conductive paste onto the front or back side of the semiconductor substrate in a predetermined shape and at a predetermined position; (II) drying the Cu-containing conductive paste; and (III) firing the Cu-containing conductive paste to form the at least one Cu electrode,
wherein, the Cu-containing conductive paste comprises:
    a) about 10-95 wt % of a powder of coated Cu particles and
    b) about 0.1-15 wt % of a glass frit, dispersed in
    c) an organic medium,
    with the total wt % of all components comprised in the paste totaling to 100 wt %, and wherein, (i) the coated Cu particles are comprised of core Cu particles that are surface coated with Ge, and the content level of Ge is about 0.01-35 parts by weight, based on 100 parts by weight of the core Cu particles; and (ii) the organic medium is comprised of at least one organic polymer dissolved in at least one solvent.

14. The solar cell of claim 13, wherein, during step (III), the Cu-containing conductive paste was fired in air.

15. The solar cell of claim 13, wherein the semiconductor substrate is selected from the group consisting of single-crystal silicons and multicrystalline silicons.

16. The solar cell of claim 13, wherein, the at least one Cu electrode is formed on the front side of the semiconductor substrate and in the form of a multiple number of parallel conductive fingers and one or more front-side bus bars that are perpendicular to the conductive fingers.

17. The solar cell of claim 13, wherein, the at least one Cu electrode is formed on the back side of the semiconductor substrate and in the form of one or more back-side bus bars.

* * * * *